(12) United States Patent
Lewis

(10) Patent No.: US 7,982,501 B2
(45) Date of Patent: Jul. 19, 2011

(54) LOW-POWER ROUTING MULTIPLEXERS

(75) Inventor: David Lewis, Ontario (CA)

(73) Assignee: Altera Corporation, San Jose, CA (US)

( * ) Notice: Subject to any disclaimer, the term of this patent is extended or adjusted under 35 U.S.C. 154(b) by 1666 days.

(21) Appl. No.: 11/130,334

(22) Filed: May 16, 2005

(65) Prior Publication Data

US 2006/0256781 A1 Nov. 16, 2006

(51) Int. Cl.
*H03K 19/003* (2006.01)
(52) U.S. Cl. .............................. 326/83; 326/68; 326/87
(58) Field of Classification Search ................... 326/30, 326/41, 50, 113, 68, 80–83, 86, 87; 327/108, 327/112
See application file for complete search history.

(56) References Cited

U.S. PATENT DOCUMENTS

| | | | | |
|---|---|---|---|---|
| 4,890,016 | A * | 12/1989 | Tanaka et al. | 326/27 |
| 4,906,870 | A | 3/1990 | Gongwer | |
| 5,081,374 | A * | 1/1992 | Davis | 326/27 |
| 5,367,206 | A * | 11/1994 | Yu et al. | 326/26 |
| 5,719,506 | A | 2/1998 | Diba et al. | |
| 5,760,601 | A * | 6/1998 | Frankeny | 326/30 |
| 5,781,034 | A | 7/1998 | Rees et al. | |
| 5,920,210 | A * | 7/1999 | Kaplinsky | 327/112 |
| 5,929,680 | A | 7/1999 | Lim | |
| 6,262,703 | B1 * | 7/2001 | Perner | 345/90 |
| 6,323,675 | B1 * | 11/2001 | Whitworth et al. | 326/30 |
| 6,326,811 | B1 * | 12/2001 | Coddington et al. | 326/83 |
| 6,437,611 | B1 * | 8/2002 | Hsiao et al. | 327/108 |
| 6,693,785 | B1 | 2/2004 | Cordier et al. | |
| 6,768,335 | B1 * | 7/2004 | Young et al. | 326/37 |
| 6,970,015 | B1 * | 11/2005 | Chan et al. | 326/82 |
| 7,084,662 | B1 * | 8/2006 | Om et al. | 326/30 |
| 7,167,020 | B2 * | 1/2007 | Allan | 326/30 |
| 7,215,141 | B2 * | 5/2007 | Lewis | 326/41 |
| 7,274,209 | B1 * | 9/2007 | Reinschmidt | 326/38 |
| 2002/0141234 | A1 | 10/2002 | Kaviani | |
| 2006/0158213 | A1 * | 7/2006 | Allan | 326/30 |

FOREIGN PATENT DOCUMENTS

CN 1340243 A 3/2002

OTHER PUBLICATIONS

Ciccarelli, Luca et al. "Low Leakage Circuit Design for FPGAs," (unpublished) submitted to the 2004 IEEE Custom Integrated Circuits Conference, Orlando, Florida, Oct. 2004.

Anderson, Jason et al., "A Novel Low-Power FPGA Routing Switch" (2004) (unpublished) submitted to the 2004 IEEE Custom Integrated Circuits Conference, Orlando, Florida, Oct. 2004.

Anderson, Jason et al., "Low-Power Programmable Routing Vircuitry for FPGAs" (2004) (unpublished) submitted to the 2004 International Conference on Computer Aided Design, San Jose, California, Nov. 2004.

* cited by examiner

*Primary Examiner* — Rexford N Barnie
*Assistant Examiner* — Crystal L Hammond
(74) *Attorney, Agent, or Firm* — Ropes & Gray LLP

(57) ABSTRACT

Low-power routing multiplexers that reduce static and dynamic power consumption are provided. A variety of different techniques are used to reduce power consumption of the routing multiplexers without significantly increasing their size. For example, power consumption of the routing multiplexers may be reduced by reducing short-circuit currents, reducing leakage currents, limiting voltage swing, and recycling charge within the multiplexer. Multiple power reduction techniques may be combined into a single routing multiplexer design. Low-power routing multiplexers may also be designed to operate in selectable modes, such as, a high-speed, high-power mode and a low-speed, low-power mode.

25 Claims, 15 Drawing Sheets

US 7,982,501 B2

LOW-POWER ROUTING MULTIPLEXERS

BACKGROUND

This invention relates to low-power routing multiplexers. More particularly, this invention relates to a routing driver input multiplexer (DIM) that reduces static and dynamic power consumption.

Power consumption is an increasing concern in the design of deep sub-micron devices, such as programmable logic devices (PLD). PLDs contain many routing DIMs as part of their programmable interconnect structure. It would therefore be desirable to reduce the overall power consumption in the PLDs by reducing both the static and dynamic power consumption of routing DIMs.

A few approaches have been presented to reduce the power consumption of a routing DIM. One approach reduces the static power consumption in the DIM by turning off the DIM when it is not being used. This reduces the static power consumption by reducing the power lost through leakage currents. The dynamic power consumption is also reduced by limiting the voltage swing of the DIM. Reducing the voltage swing of the DIM reduces the power consumed by the DIM, but it also reduces the speed of the DIM and only provides a "weak" high logic output signal. Neither of these side effects of the reduced voltage swing significantly affect the performance of a PLD incorporating this DIM design. However, the proposed DIM design may significantly increase the size of each DIM, thereby increasing the size of the PLD.

In view of the forgoing, it would be desirable to provide a DIM with reduced static and dynamic power consumption that may reduce the overall power consumption of the PLD without significantly increasing the size of the PLD. It would also be desirable to provide multiple reduced-power DIM designs which may provide a variety of techniques for reducing power consumption, such that the optimal DIM may be selected based on its role and position within the PLD.

BRIEF SUMMARY

In accordance with the invention, low-power routing driver input multiplexers (DIM) are provided. Multiple low-power DIM embodiments are provided that reduce both static and dynamic power consumption using a variety of different techniques, without greatly increasing the size of the DIM.

In accordance with the invention, short circuit currents may be reduced by splitting a first stage of the DIM into two halves. Each half of the first stage is designed with different trip points, thereby limiting a short-circuit path from supply to ground that is present in a typical DIM during switching.

In accordance with the invention, leakage currents may be reduced by cutting off transistors in the DIM.

In accordance with the invention, a DIM with a reduced voltage swing is provided. The voltage swing may be reduced from either the high voltage level or the low voltage level. Charge may also be recycled within the DIM to decrease the power consumption of the DIM during switching.

In accordance with the invention, various combinations of these power reduction techniques may be used. Further, in accordance with the invention, control signals may be used to adjust operating modes of a DIM. For example, a DIM may be switched between a high-speed, high-power mode and a low-speed, low-power mode depending on its speed requirements.

Further features of the invention, its nature and various advantages, will be more apparent from the accompanying drawings and the following detailed description of the preferred embodiments.

DETAILED DESCRIPTION

Figure 1:
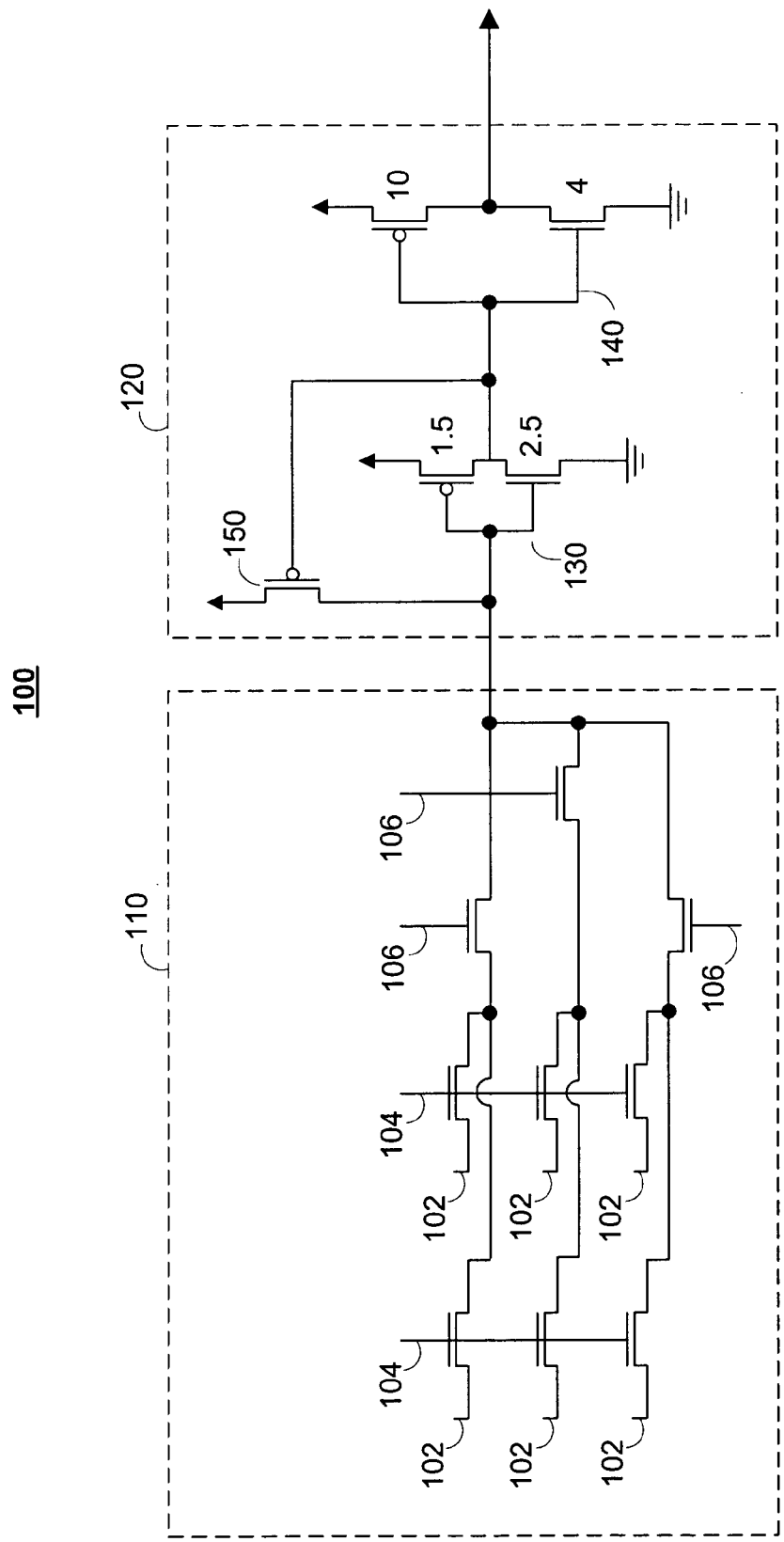
FIG. 1 shows an illustrative schematic of a conventional routing driver input multiplexer (DIM).

FIG. 1 shows conventional routing driver input multiplexer (DIM) 100. Programmable logic device (PLD) interconnects may contain variable length wire segments and programmable routing switches, such as routing DIM 100. Routing DIM 100 contains multiplexer 110 and driver 120 comprising two buffers 130 and 140. The term DIM will be used to refer to both the multiplexer and driver 100, while the terms multiplexer and driver in isolation, or DIM multiplexer and DIM driver, refer to 110 and 120 respectively.

Multiplexer 110 includes six data inputs 102, two first level select inputs 104, and three second level select inputs 106. One of the six data inputs 102 may be selected via inputs 104 and 106 to be output by multiplexer 110. First level select inputs 104 and second level select inputs 106 may be controlled by memory configuration bits, combinational logic, or by any other suitable means.

Multiplexer 110 is illustrated with six data inputs 120 so as not to overcomplicate the drawing. It is understood that multiplexer 110 may be designed to support any suitable number of data inputs. Further, other suitable multiplexer designs may also be substituted for multiplexer 110. In some embodiments multiplexer 110 may have data paths that differ in depth from input to output. The signal applied to selected data input 102 is output from multiplexer 110 and is input to buffer 120.

Buffer 120 includes two buffer stages, first stage 130 and second stage 140. The sizes of the transistors that make up first stage 130 and second stage 140 are included in FIG. 1 to show the relative sizing between the two stages, as well as the P/N ratio of each stage, i.e., the ratio in size between the PMOS transistor and NMOS transistor in each stage. Further, the exemplary transistor sizes are given to more clearly illustrate the relationship between a typical DIM and each of the embodiments of the present invention. These transistor sizes are merely illustrative and may be modified based on performance requirements of the DIM.

First stage 130 of buffer 120 includes a level-restoring transistor 150. Level-restoring transistor 150 is enabled to pull-up a "weak" high logic input signal to the full high logic voltage of $V_{DD}$. When a high logic input signal is input through multiplexer 110 to buffer 120, the NMOS pass transistors of multiplexer 110 may reduce the high logic input signal by approximately $V_{TN}$, the threshold voltage of the pass transistor. This results in a "weak" high logic input signal. Although all of the embodiments of the present invention are illustrated with level-restoring transistors, such as level-restoring transistor 150, the level-restoring transistors may not be required. Alternatively, multiplexer 110 may be replaced with a multiplexer design that does not reduce high logic input signals, such as a fully complementary (CMOS) design. Alternatively using a higher voltage on the gates of the multiplexer transistors compared to the supply voltage on the driver may also eliminate the need for a level restore.

To further compensate for "weak" high logic input signals input to buffer 120, the P/N ratio of first stage 130 may be skewed to a reduced trip point (i.e., the voltage above which is considered a high logic level and below which is considered a low logic level). A reduced trip point may allow first stage 130 to be more sensitive to "weak" high logic input signals. First stage 130 may be skewed to a lower trip point by reducing the P/N ratio. For example, in DIM 100 the P/N ratio of first stage 130 is 1.5/2.5 while the P/N ratio of second stage 140 is set to a more conventional ratio of 10/4.

Programmable logic devices (PLD) have many DIMS, like DIM 100, as part of their programmable interconnect structure. It would therefore be desirable to reduce the total power consumption in the PLDs by reducing power consumption of all of the DIMs. One approach to this problem has been described in an article by Jason H. Anderson and Farid N. Najm, *A Novel Low-Power FPGA Routing Switch*, Department of Electrical and Computer Engineering, University of Toronto, Toronto, Ontario, Canada, pages 1-8, which is hereby incorporated in its entirety.

Figure 2:
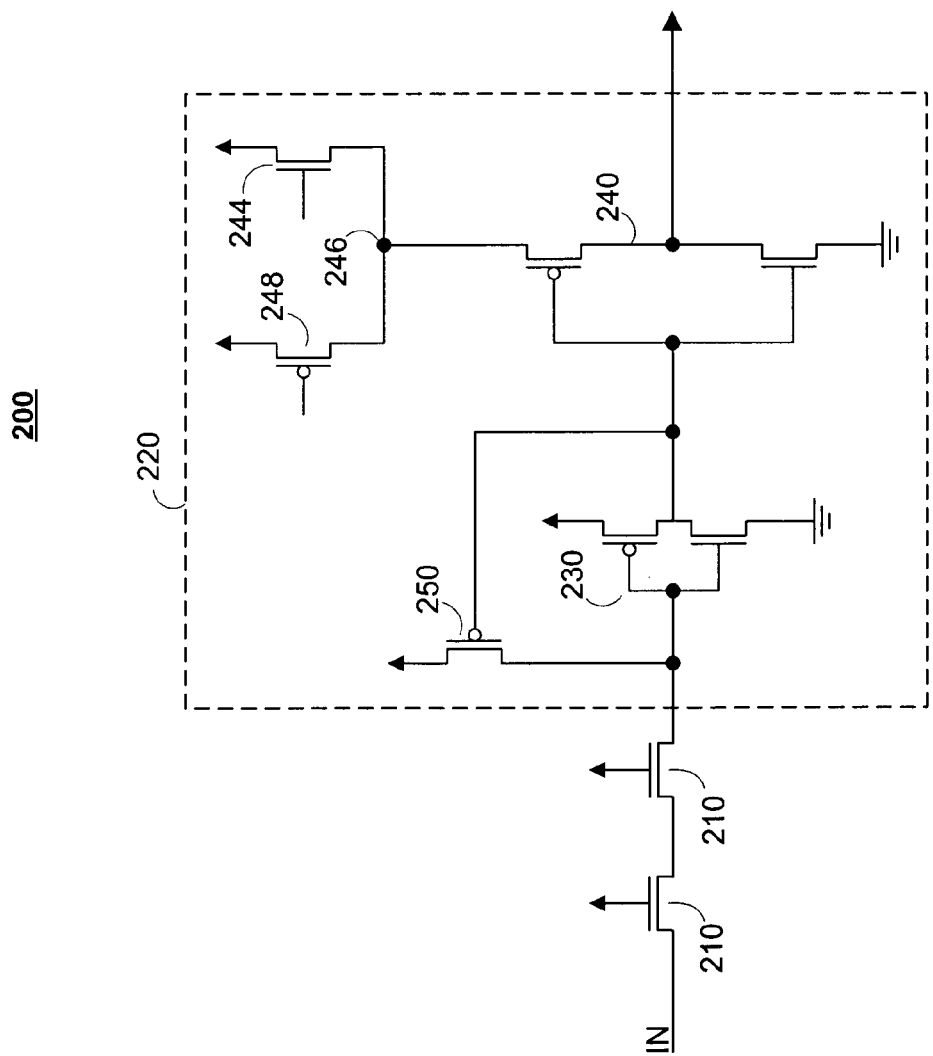
FIG. 2 shows an illustrative schematic of a large-area, low-power DIM.

The DIM design proposed by Anderson and Najm is illustrated in FIG. 2. DIM 200 includes buffer 220, which operates in a similar manner as buffer 120, but contains additional NMOS transistor 244 and PMOS transistor 248. Buffer 220 also contains a first stage 230 and a second stage 240. In an attempt to simplify the illustration, multiplexer 110 is replaced in this illustration by two NMOS passgates 210. NMOS passgates 210 represent the signal path of an input signal propagating through a multiplexer, such as, multiplexer 110, wherein a signal input to a selected data input 102 is passed through two of the multiplexer's NMOS passgates before the signal is input to buffer 220.

Buffer 220 can operate in three different modes depending on the settings of NMOS transistor 244 and PMOS transistor 248. In a high-speed mode, PMOS transistor 248 is turned on to allow the output of second stage 240, and consequently buffer 220, to have a full rail-to-rail voltage swing and to output a high logic signal with a voltage of $V_{DD}$. NMOS transistor 244 may also be turned on in this high-speed mode. In a low-speed mode, PMOS transistor 248 is turned off and NMOS transistor 244 is turned on. As a result, second stage 240 is operated with a reduced or "weak" high logic signal having a maximum voltage level approximately equal to $V_{DD}-V_{TN}$. The reduced voltage swing of buffer 220 reduces the power consumption of DIM 200, but also reduces the speed of DIM 200. Finally, in a sleep mode, both NMOS transistor 244 and PMOS transistor 248 are turned off. This reduces the leakage current of buffer 220, thereby reducing the power consumed when buffer 220 is idle.

While buffer 220 provides power savings, transistors 244 and 248 must be made large in order to avoid an excessive speed penalty. Thus, the approach of DIM 200 would result in a much larger DIM design.

In accordance with the invention, various DIM designs are presented which may reduce the static and dynamic power consumption in DIMs without significantly increasing the area of the present designs.

Figure 3:
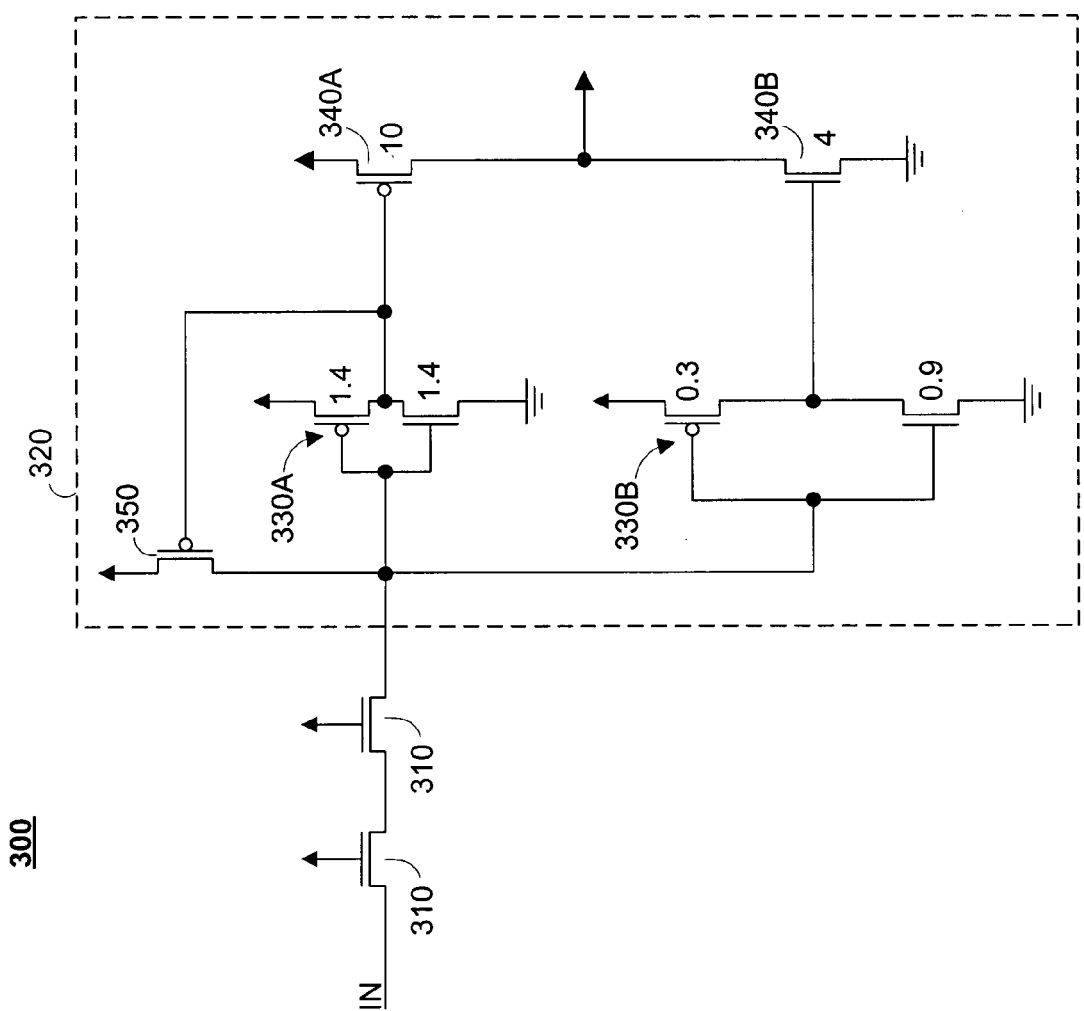
FIG. 3 shows an illustrative schematic of a first embodiment of a low-power DIM in accordance with the invention.

FIG. 3 shows illustrative DIM 300 in accordance with one aspect of the present invention. DIM 300 reduces dynamic power consumption by decreasing short-circuit currents that occur during DIM switching. For example, when buffer 120 transitions between a low and a high logic output level, there is a brief period when both the NMOS and the PMOS transistors of second stage 140 are turned on. During this period, there is a short-circuit current from $V_{DD}$ to ground. Reducing or eliminating short-circuit currents in the DIM buffer may reduce the overall DIM power consumption.

In DIM 300, the first stage of buffer 320 is split into two halves, first stage 330A and first stage 330B. The split first stages 330A and 330B may be designed to occupy approximately the same total transistor width as single first stage 130 (FIG. 1). As such, split first stages 330A and 330B may be designed such that DIM 300 is not significantly larger than typical DIM 100. Other embodiments may be larger, but the present embodiment illustrates that, in accordance with this invention, it is possible to obtain this power reduction without an increase in total transistor width.

Split first stage 330A is connected to PMOS transistor 340A which, when activated, pulls the output of DIM 300 to a high logic level. Split first stage 330B is connected to NMOS transistor 340B which, when activated, pulls the output of DIM 300 to a low logic level. Split first stage 330A and split first stage 330B may be split approximately in proportion to the width of second stage transistors 340A and 340B.

The P/N ratio of split first stages 330A and 330B may be set such that first stage 330A may be turned on at a higher input voltage level (than, for example, first stage 130) and first stage 330B may be turned on at a lower voltage level. For example, first stage 330A may have a P/N ratio of around 1.4/1.4, while inverter 330B may have a P/N ratio of around 0.3/0.9. As a result of skewing the trip points by varying the P/N ratios of split first stages 330A and 330B, the amount of time that both PMOS and NMOS inverters 340A and 340B are simultaneously turned on is reduced. As a result, the short-circuit current through DIM 300 is reduced.

Figure 4:
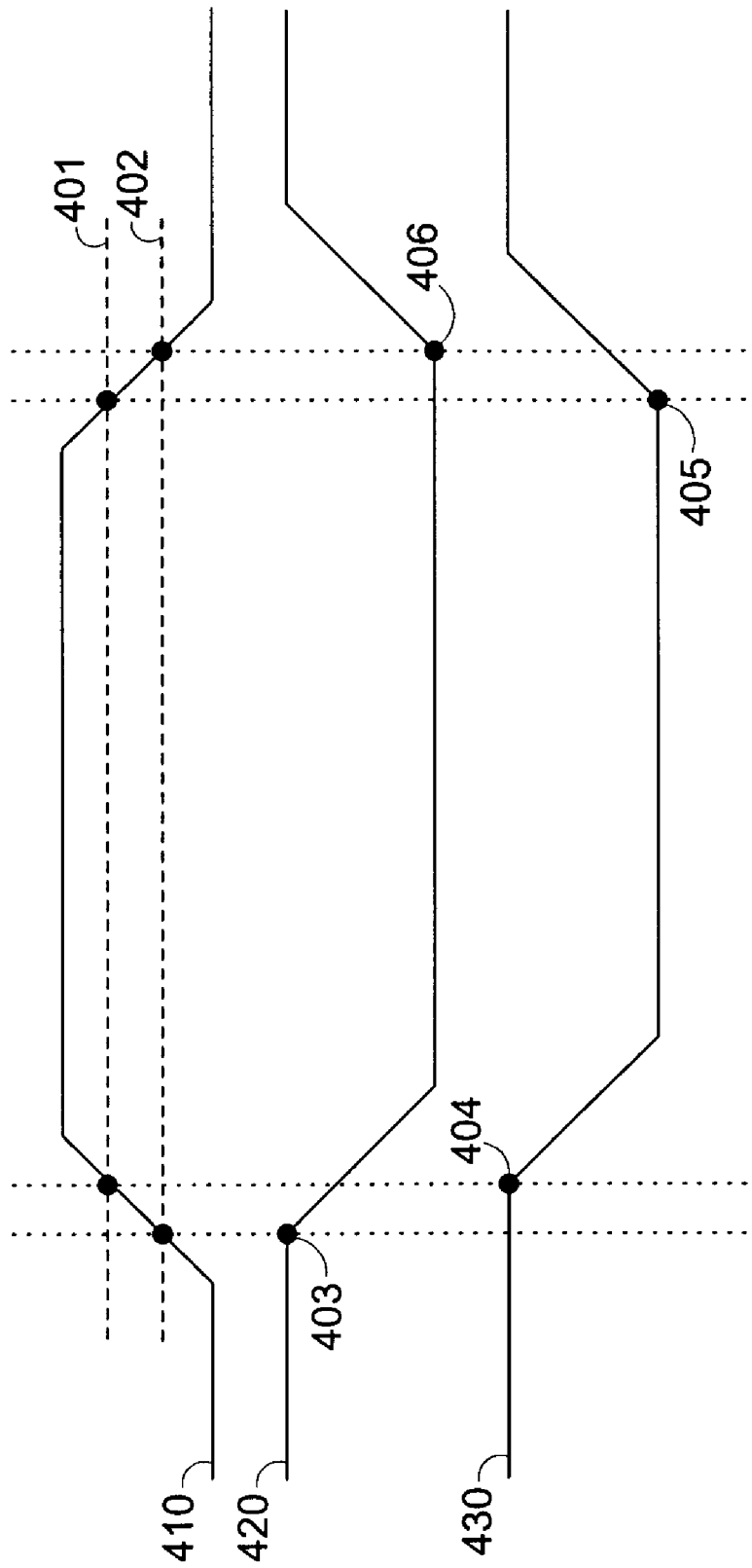
FIG. 4 shows a chart illustrating the operation of a DIM with a split first stage in accordance with the invention.

FIG. 4 illustrates the operation of split first stages 330A and 330B of buffer 320 in DIM 300, in accordance with the invention. Input signal 410 represents the input signal to DIM 300, which enters multiplexer passgates 310 and is propagated through to the inputs of split first stages 330A and 330B. Normally, the trip point for a first stage (e.g., first stage 130) is set to the midpoint between the high and low logic voltage levels. In the present embodiment, however, split first stage 330A switches at a slightly higher voltage level, represented by dotted line 401, and split first stage 330B switches at a slightly lower voltage level, represented by dotted line 402. Thus, during the transition of input signal 410 from a low to a high logic voltage level, split first stage 330A switches later (point 404) than split first stage 330B (point 403). In other words, NMOS transistor 340B is turned off by split first stage 330B before PMOS transistor 340A is turned on by split first stage 330A. As a result, the short-circuit current during the transition of the output of DIM 300 from a low to high voltage level is reduced. Similarly, when input signal 410 transitions from a high logic voltage level back to a low logic voltage level, split first stage 330A switches earlier (point 405) than split first stage 330B (point 406), thereby turning off PMOS transistor 340A before NMOS transistor 340B is turned on.

Figure 5:
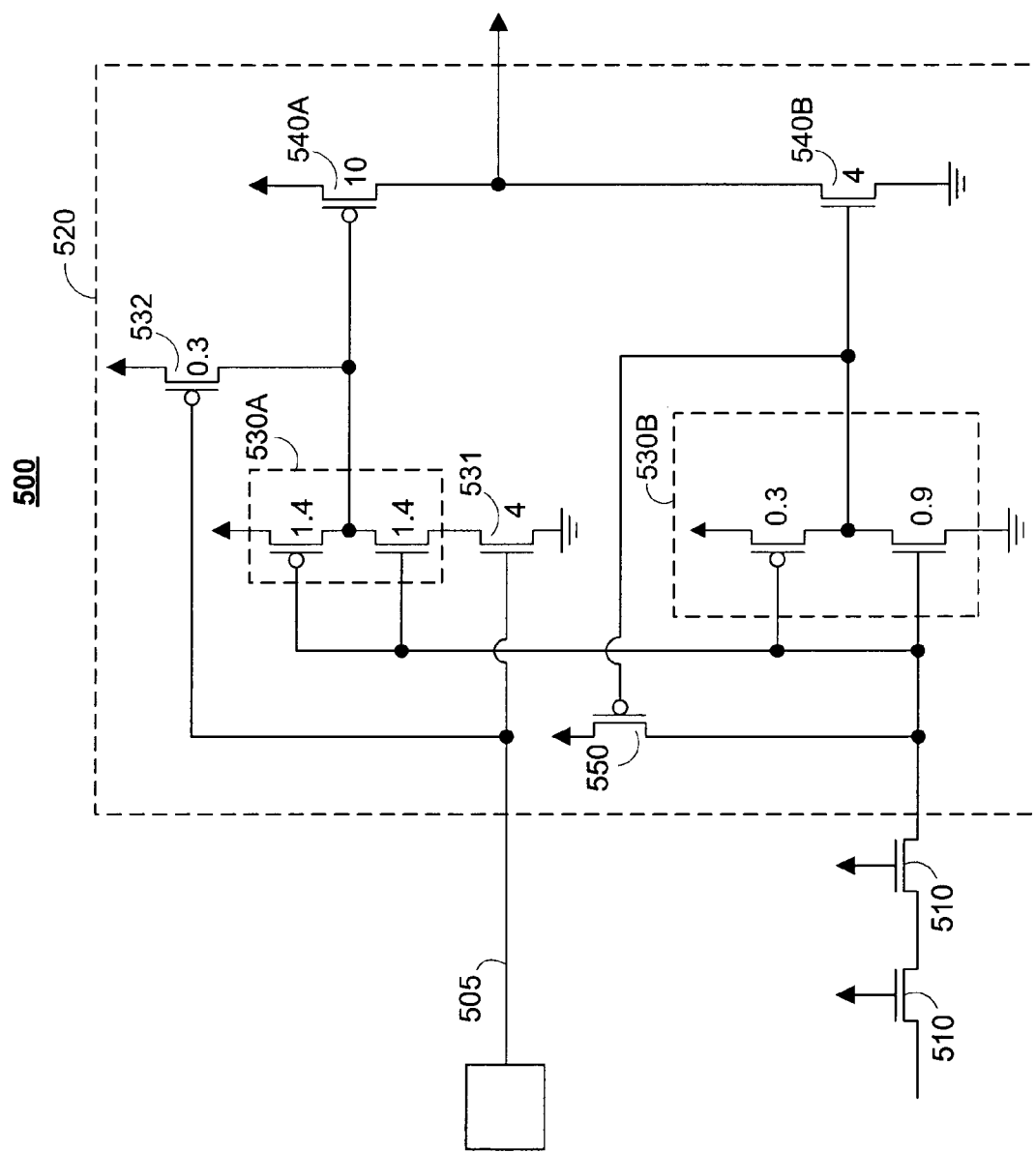
FIG. 5 shows an illustrative schematic of a second embodiment of a low-power DIM in accordance with the invention.

FIG. 5 illustrates DIM 500, another embodiment of the present invention. DIM 500 reduces power consumption by reducing leakage current while the DIM is not being used and also by reducing the short circuit current in a similar manner as in DIM 300. All of the elements of DIM 500 behave in a similar manner to their counterparts in DIM 300. DIM 500 also includes additional transistors 531 and 532 and control input 505. Further, level-restoring transistor 550 is connected to split first stage 530B instead of split first stage 530A.

Control input 505 permits DIM 500 to be enabled and disabled. When control input 505 is set to a low logic value, DIM 500 is disabled. NMOS transistor 531 is turned off and PMOS transistor 532 is turned on. As a result, the gate of PMOS transistor 540A is forced to a high logic state and thus PMOS transistor 540A is prevented from turning on. In this disabled mode, leakage current is reduced by forcing PMOS driver 540A to turn off. When control input 505 is set to a high logic value, DIM 500 is enabled and may operate in a similar manner as DIM 300. NMOS transistor 531 may be made large and PMOS transistor 532 may be made small to minimize the speed degradation of the present embodiment. For example, NMOS transistor 531 may have a width of 4, while PMOS transistor 532 may have a width of 0.3.

Figure 6:
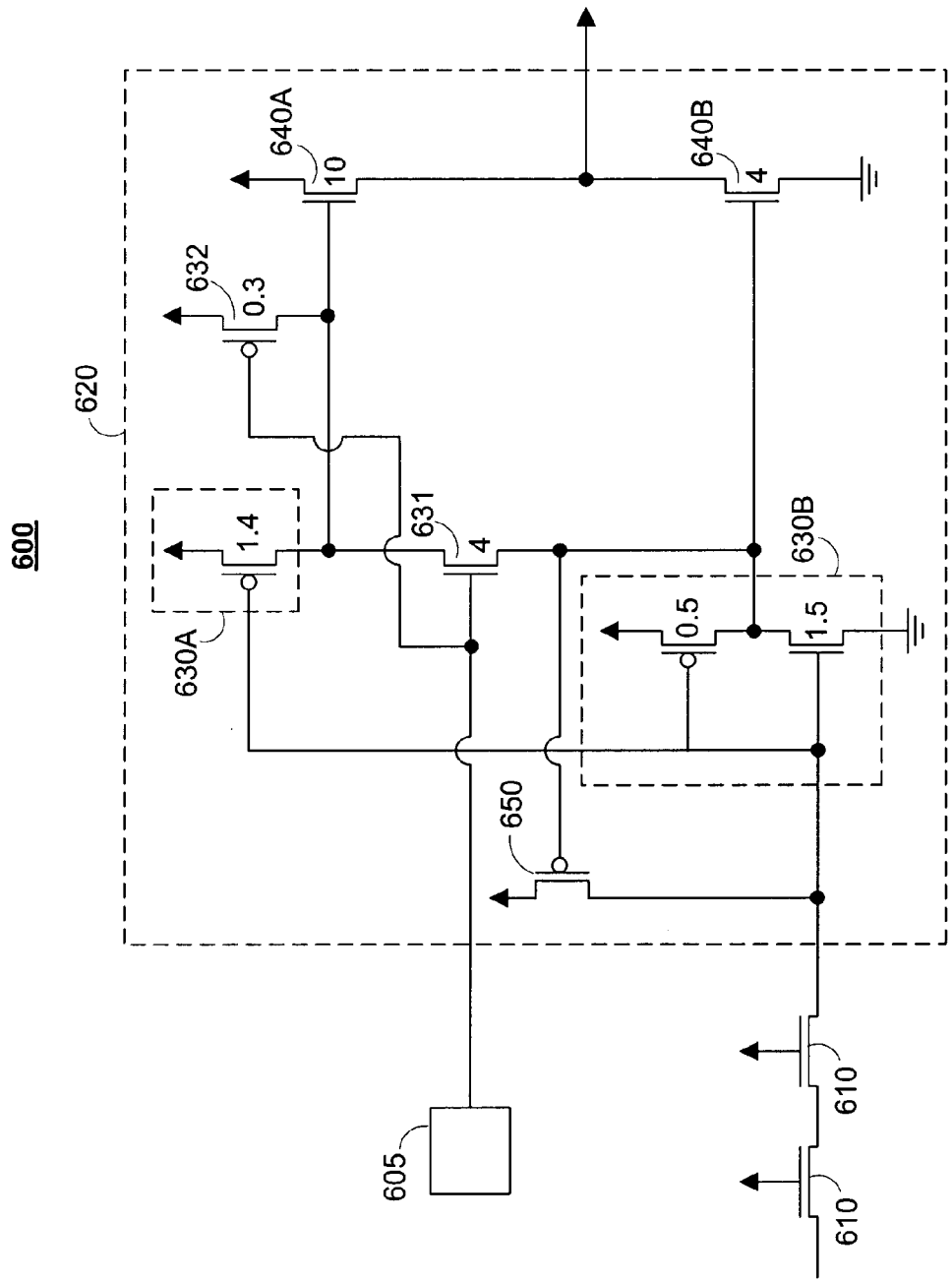
FIG. 6 shows an illustrative schematic of a third embodiment of a low-power DIM in accordance with the invention.

FIG. 6, illustrates DIM 600, which is a variation of DIM 500. In this variation, the order of NMOS transistor 631 is switched with the NMOS transistor of split first stage 630A. Switching the order of the transistors, allows the bottom transistor, formerly the NMOS transistor of split first stage 630A, to be shared with split first stage 630B. This variant provides area savings by eliminating an NMOS transistor, but also reduces the speed of the DIM.

Figure 7A:
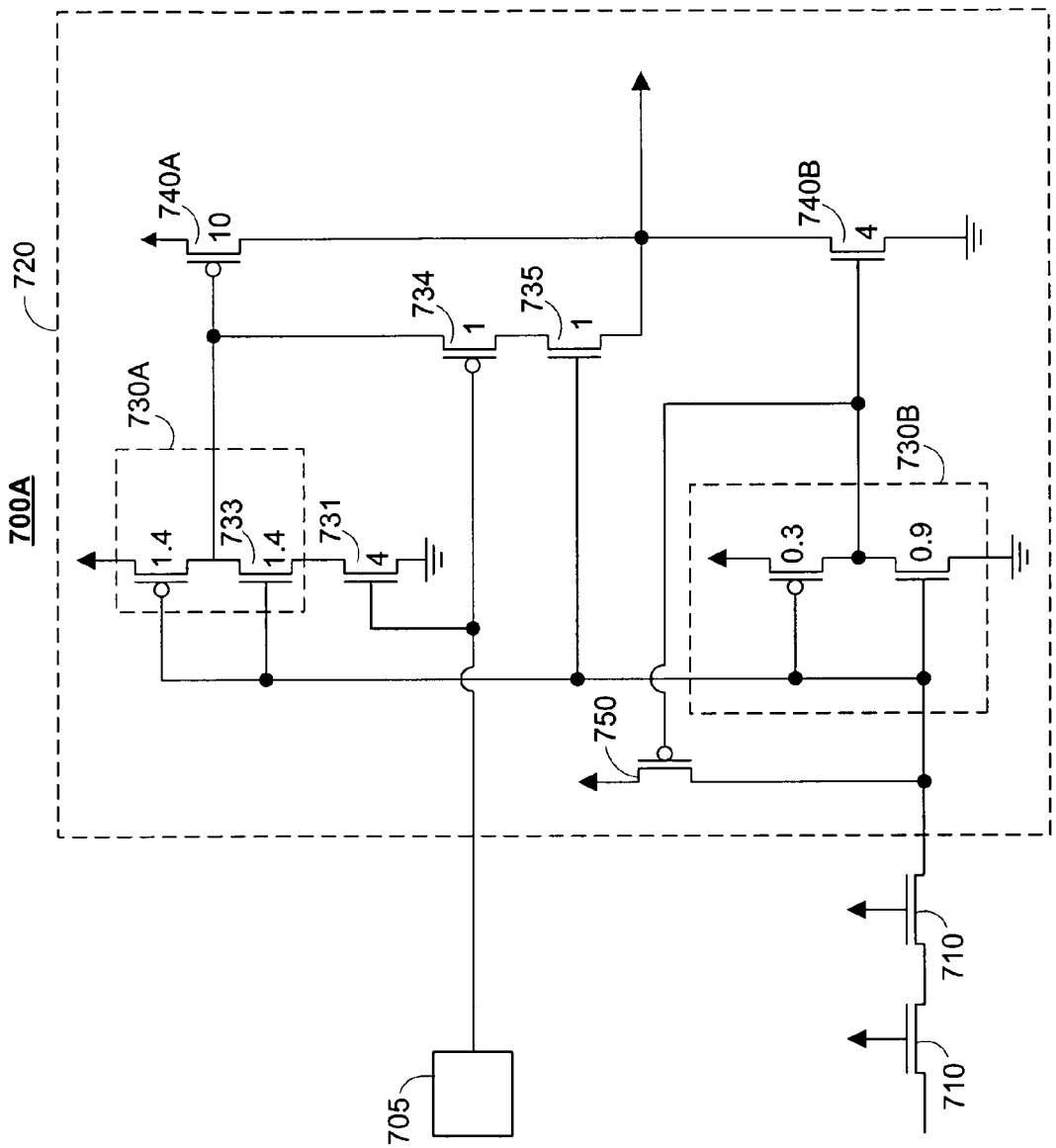
FIGS. 7A, 7B, 7C, and 7D show illustrative schematics of variations on a fourth embodiment of a low-power DIM in accordance with the invention.

Another embodiment of the present invention, DIM 700A, is shown in FIG. 7A. Unlike DIM 200, which reduces dynamic power consumption by introducing large transistors in series with the output PMOS transistors, DIM 700A uses smaller logic transistors to limit the power consumption. In DIM 200, transistors 244 and 248 supply the entire drive current of the DIM driver and are therefore comparable or larger in size to transistor 240. In contrast, the present embodiment reduces dynamic power consumption by using pre-driver transistors 731, 734, 735 to adjust the voltage level. These pre-driver transistors only need to be comparable in size to the much smaller pre-driver transistors in 730A and therefore save area relative to transistors 244 and 248 of DIM 200 that are placed in series with a main driver transistor. Further, this circuit also reduces power by recycling the gate charge.

All of the elements of DIM 700A behave in a similar manner to their counterparts in DIM 300. DIM 700A also includes additional transistors 734, 735, and 731. Control input 705 switches DIM 700A between a high-speed, high-power mode and a low-speed, low-power mode. (This is in contrast to control input 505 of DIM 500, which switches DIM 500 between enabled and disabled modes.)

When control input 705 is set to a high logic level, DIM 700A operates in the high-speed, high-power mode. PMOS transistor 734 is turned off, which also disconnects NMOS transistor 734. NMOS transistor 731 is turned on, allowing split first stage 730A to operate normally. Thus, it can be seen that in high-speed, high-power mode DIM 700A operates in a similar manner as DIM 300.

When control input 705 is set at a low logic level, DIM 700A operates in the low-speed, low-power mode. PMOS transistor 734 is turned on, connecting NMOS transistor 735 between the gate and drain of PMOS transistor 740A. NMOS transistor 731 is turned off, disconnecting split first stage 730A from ground and coupling it to the output of DIM 700A. Thus, in this low-speed, low-power mode, the output of DIM 700A will be limited by the threshold voltage $V_{TN}$ of NMOS transistor 735, making the maximum output of DIM 700 equal to $V_{DD}-V_{TN}$ (where $V_{TN}$ incorporates the threshold voltage as well as the body effect of NMOS transistor 735). Furthermore, the gate node of the driver PMOS transistor 740A must be pulled down to below $V_{DD}-|V_{TP}|$, so the output will reach a static equilibrium at $V_{DD}-V_{TN}-|V_{TP}|$. It may be necessary to use low $V_t$ transistors in order to achieve acceptable speed with this approach due to the two threshold drops.

DIM 700A provides further power savings by recycling the gate charge of PMOS transistor 740A. Ordinarily, during a low-to-high transition, the gate charge of PMOS transistor 740A is drained to ground through split first stage 730A. However, while DIM 700A is in low-speed, low-power mode, during a low-to-high transition the gate charge of PMOS transistor 740A charges up the output of DIM 700A. This charge recycling further reduces the total amount of energy that needs to be supplied for a transition.

According to a related embodiment of the present invention, the order of the pre-driver transistors may be rearranged without affecting the functionality of the DIM. For example, transistors 734 and 735 or transistors 731 and 733 may be swapped without significantly affecting the performance of DIM 700A.

Figure 7B:
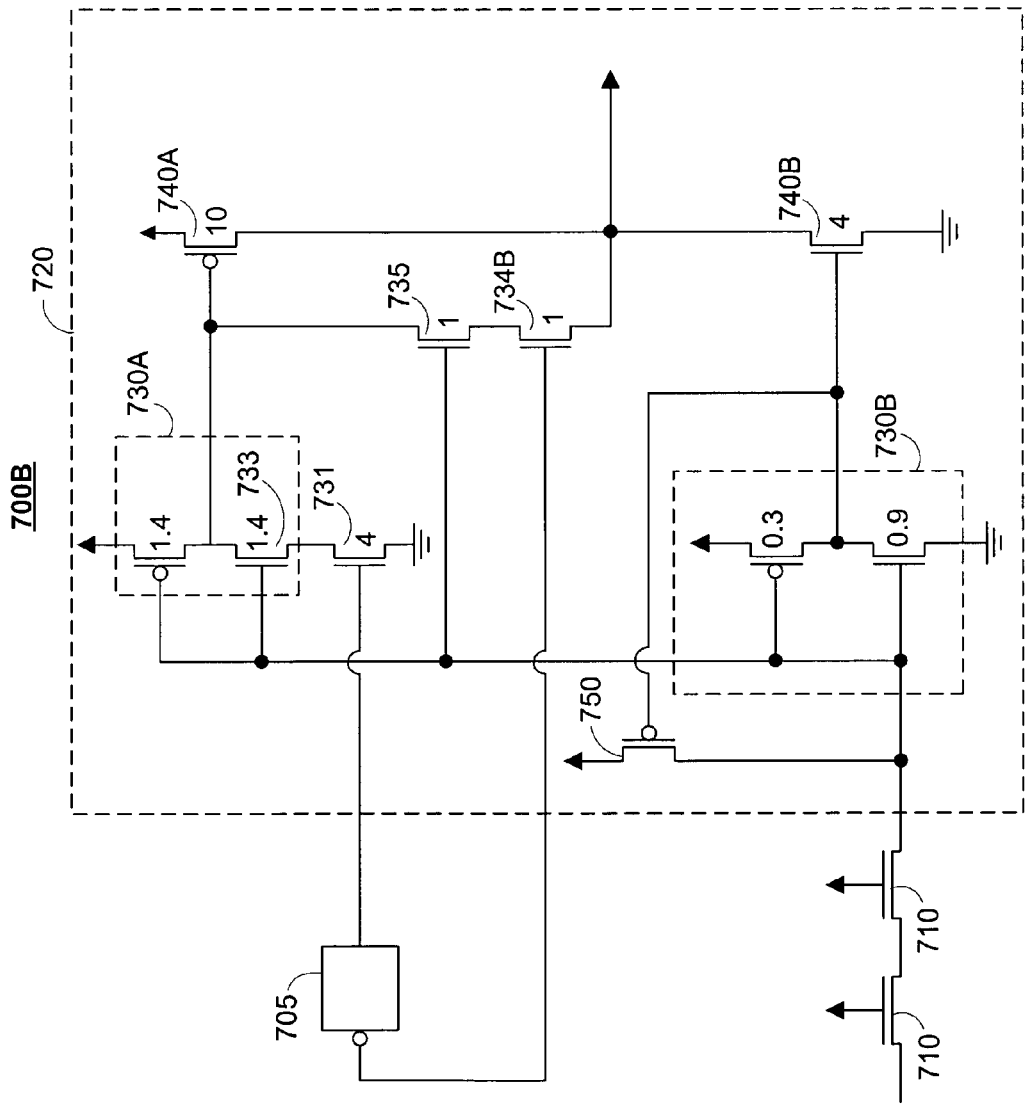
Figure 7C:
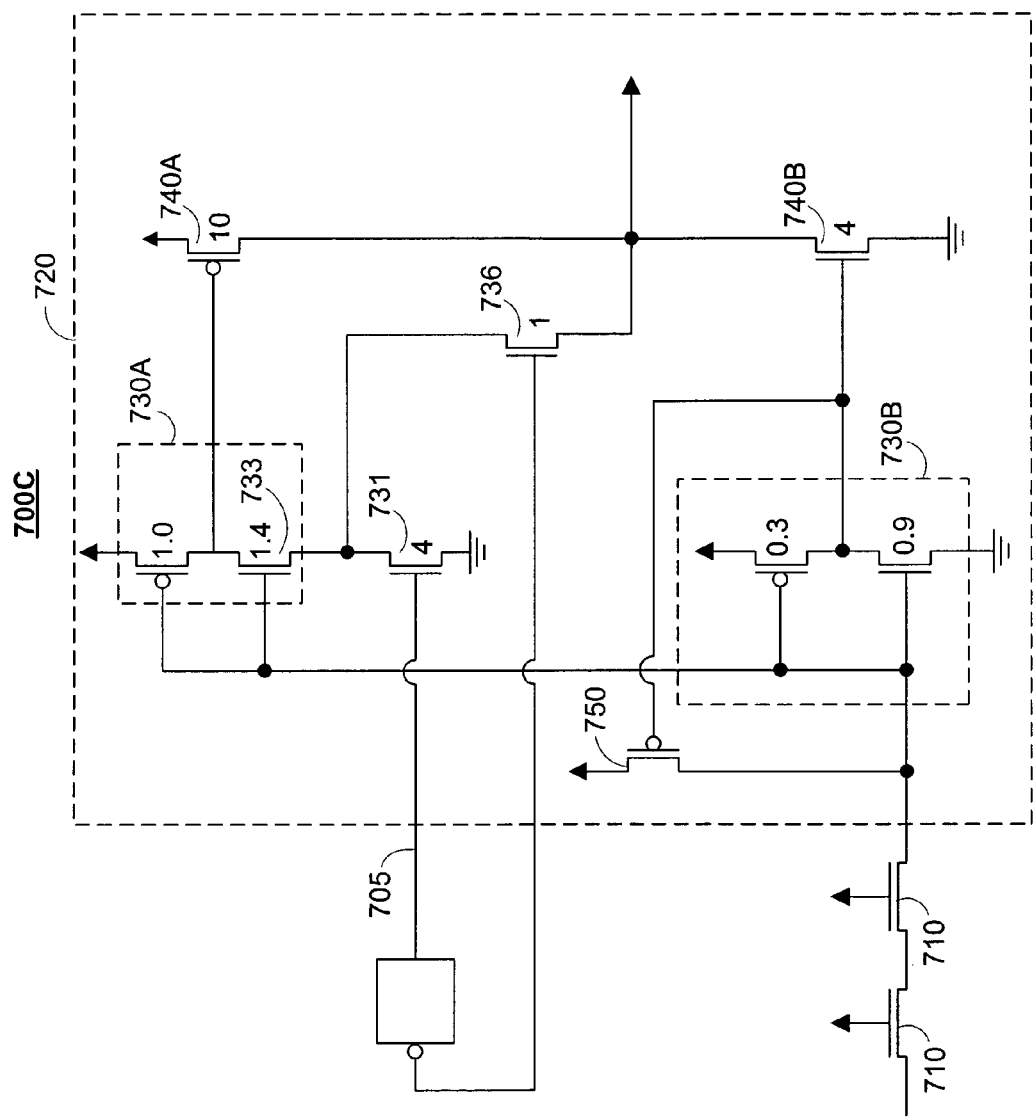
Figure 7D:
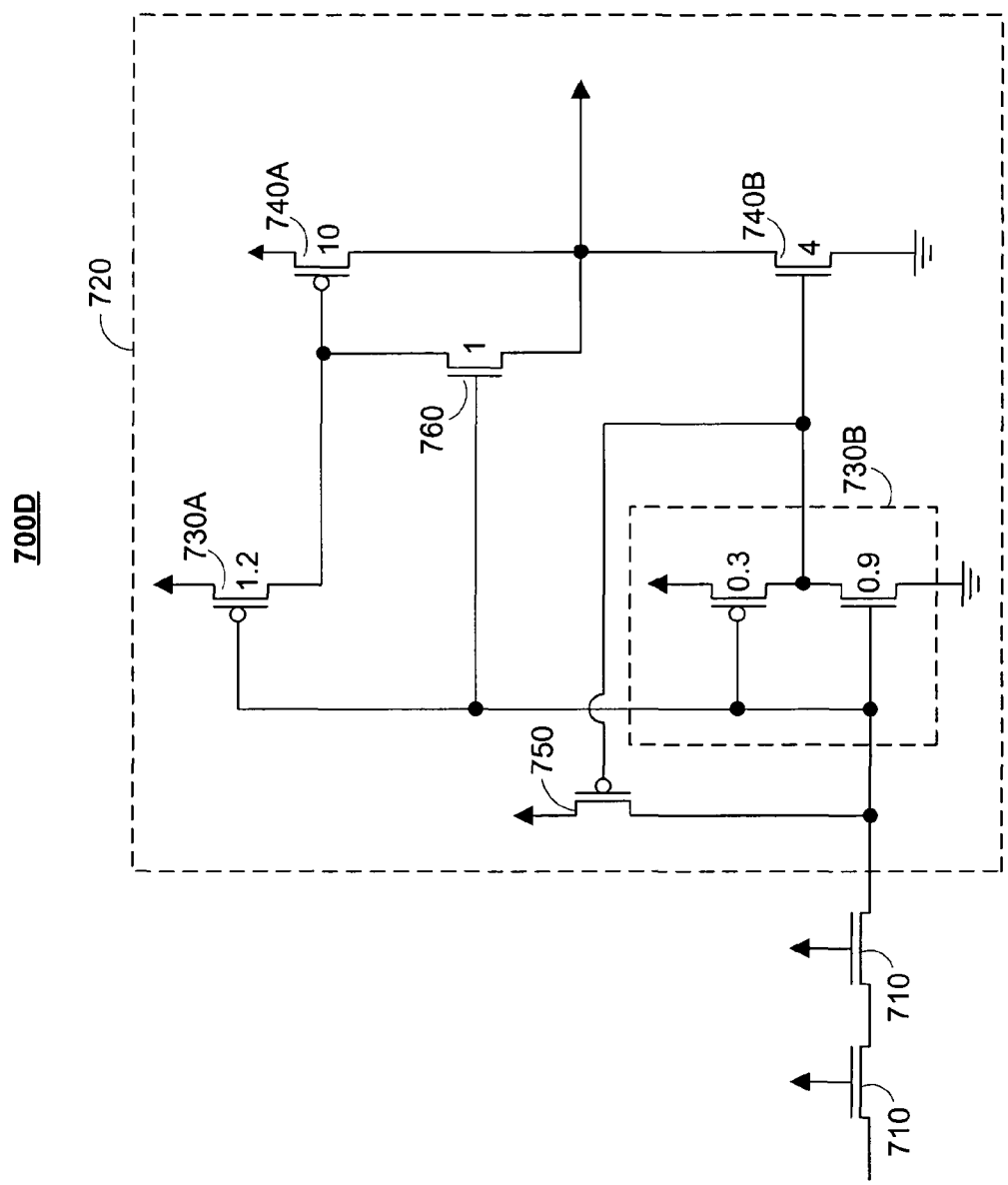

FIGS. 7B, 7C, and 7D illustrate DIMs 700B, 700C and 700D, which are all examples variations of DIM 700A in accordance with the present invention. In DIM 700B PMOS transistor 734 of DIM 700A is replaced by NMOS transistor 734B. Replacing the PMOS transistor with an NMOS transistor avoids the threshold voltage drop of PMOS transistor 734 and thereby improves the speed of the driver. A second variation of DIM 700A is illustrated in FIG. 7C. DIM 700C has a smaller area and increased speed by replacing transistors 734 and 735 with a single NMOS transistor 736. FIG. 7D illustrates DIM 700D, a non-configurable version of DIM 700A. DIM 700D always operates in a low power mode and thus cannot be configured for high-speed operation, but has fewer transistors and is smaller than DIM 700A.

Figure 8A:
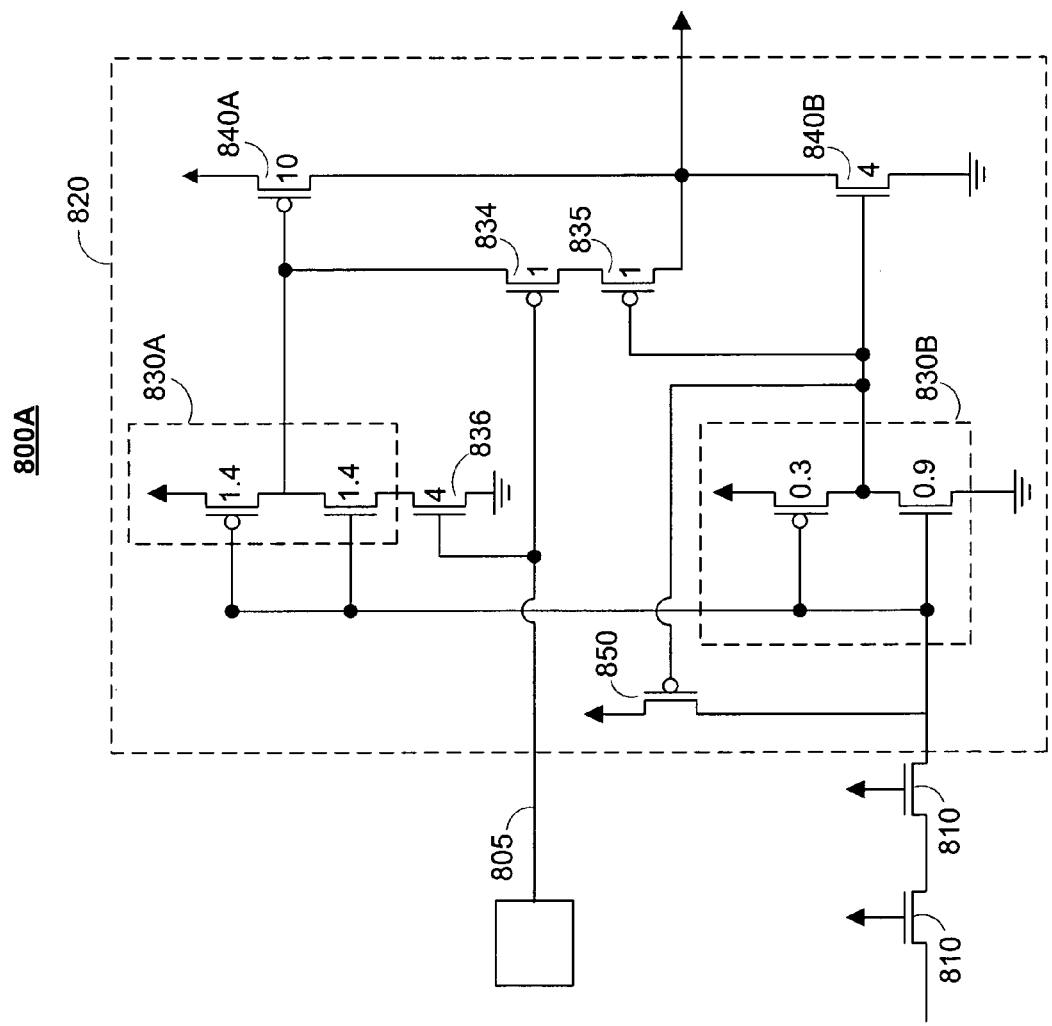
FIGS. 8A and 8B show an illustrative schematic of variations of a fifth embodiment of a low-power DIM in accordance with the invention.
Figure 8B:
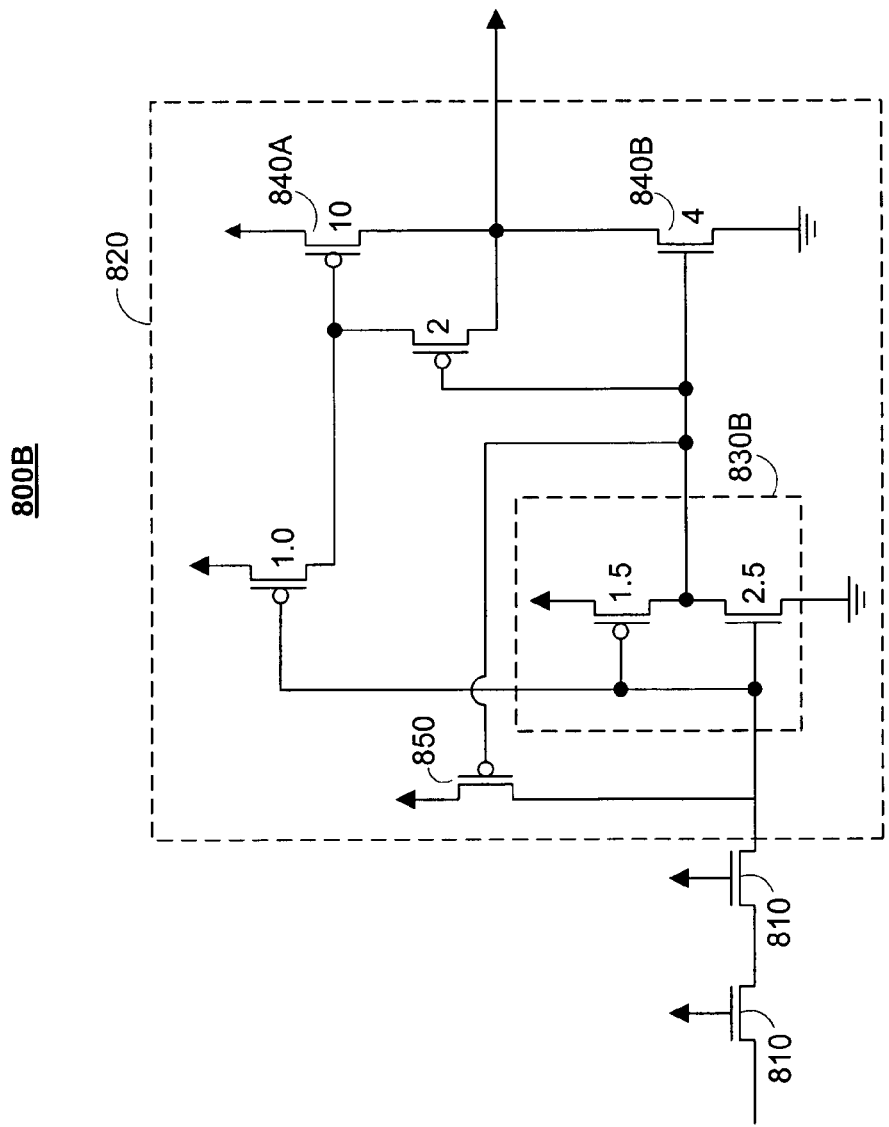

FIG. 8A illustrates DIM 800A, yet another variation of DIM 700A, in accordance with the invention. In DIM 800A, NMOS transistor 735 is replaced with PMOS transistor 835. The gate of PMOS transistor 835 is connected to a signal complementary to the signal connected the gate of NMOS 735. DIM 800A has an output voltage swing of $V_{DD}-|V_{TP}|$, where $V_{TP}$ is the threshold voltage of PMOS transistor 835. Advantageously, the output voltage swing of DIM 800A is less affected by the body effect of PMOS transistor 835, speeding up the circuit. FIG. 8B illustrates DIM 800B. DIM 800B is a non-configurable version of DIM 800A, in which the configuration bit and gating transistors are eliminated in a similar manner as DIM 700D of FIG. 7D.

Figure 9:
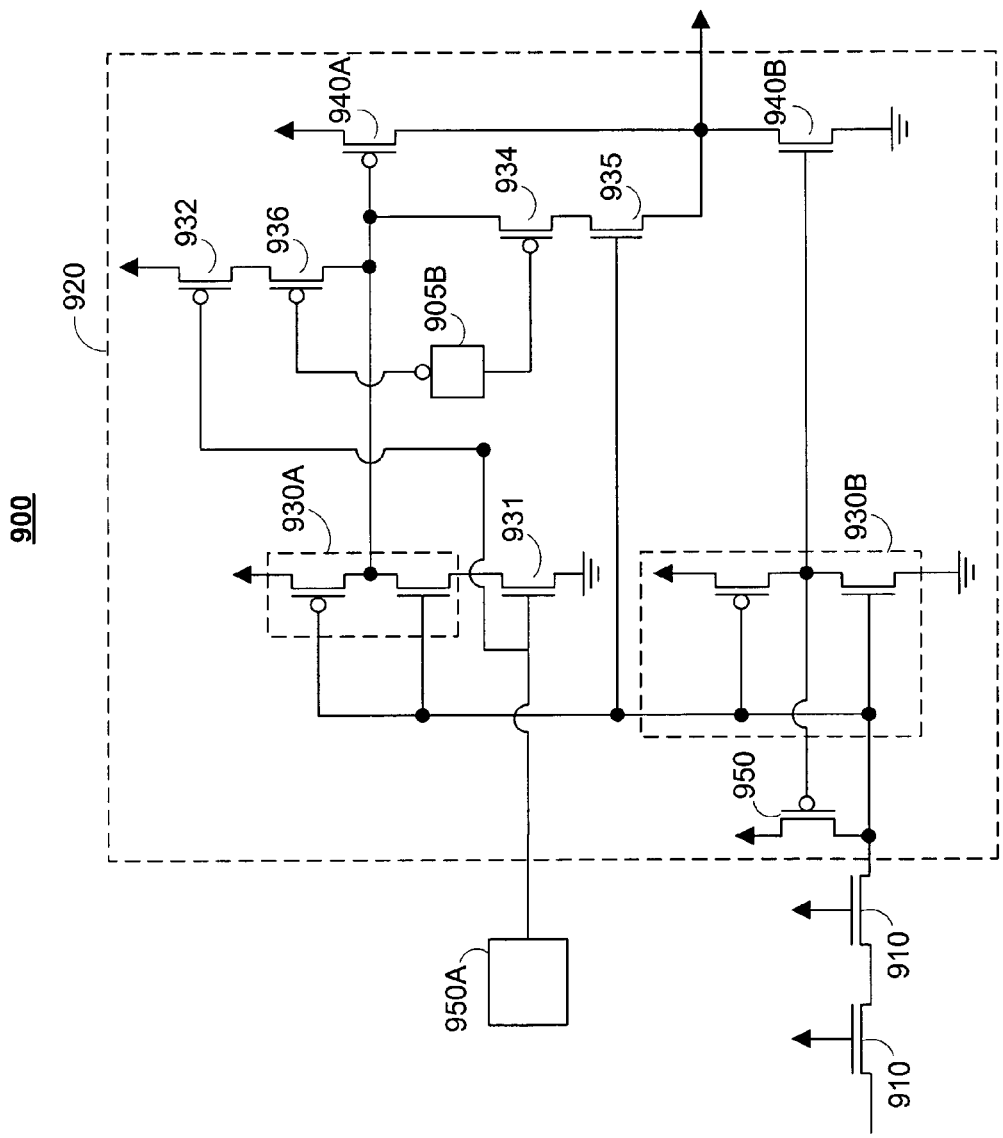
FIG. 9 shows an illustrative schematic of a sixth embodiment of a low-power DIM in accordance with the invention.

FIG. 9 illustrates DIM 900, which combines the features of DIM 500 and DIM 700A in accordance with the invention. DIM 900 includes control inputs 905A and 905B. Control input 905A switches DIM 900 between high speed and low speed modes, in a similar manner to control input 705 (FIG. 7A). Control input 905B switches DIM 900 between a enabled and disabled mode, in a similar manner to control input 505 (FIG. 5). Control inputs 905A and 905B must be placed in both low speed and disabled mode, respectively, to disable the DIM. The operation of DIM 900 and its various operating modes can be understood from the above description of DIM 500 and DIM 700A.

Figure 10:
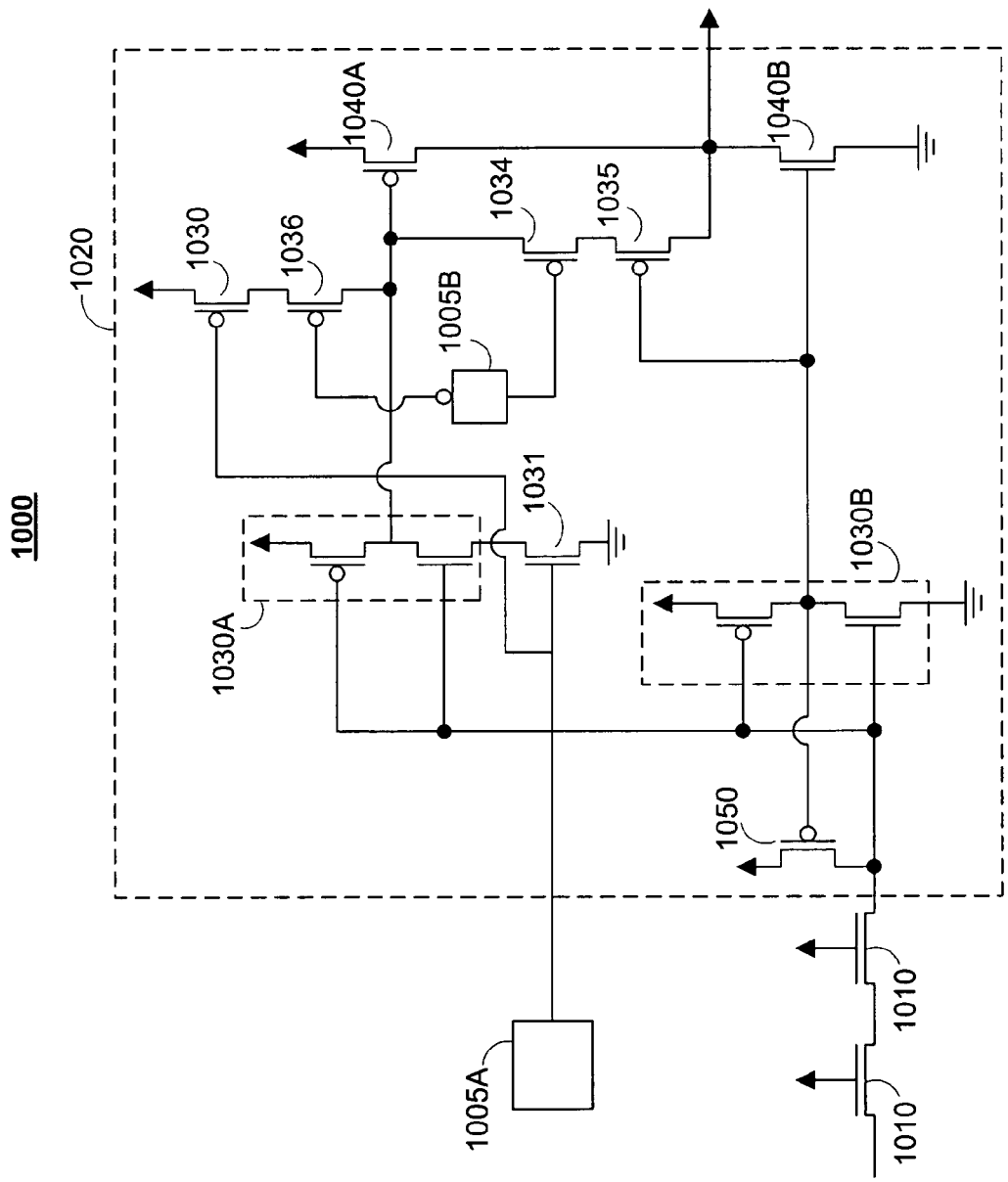
FIG. 10 shows an illustrative schematic of a seventh embodiment of a low-power DIM in accordance with the invention.

FIG. 10 illustrates DIM 1000, which combines the features of DIM 500 and DIM 800A in accordance with the invention. DIM 1000 includes control inputs 1005A and 1005B. Control input 1005A switches DIM 1000 between a high-speed, high-power mode and a low-speed, low-power mode, in a similar manner to control input 805. Control input 1005B switches DIM 1000 between enabled and disabled modes, in a similar manner to control input 505 (FIG. 5). The operation of DIM 900 and its various operating modes can be understood from the above description of DIM 500 and DIM 800A.

Figure 11:
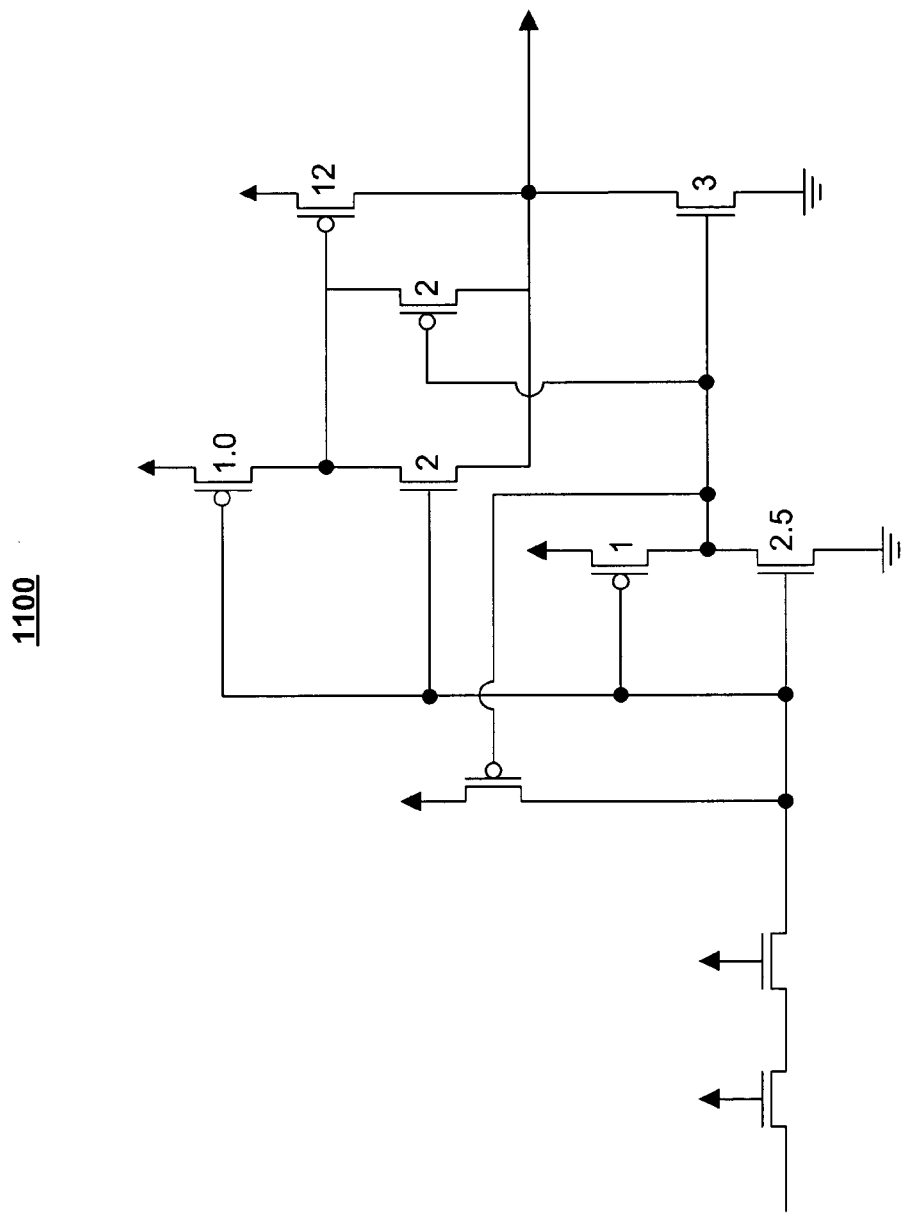
FIG. 11 shows an illustrative schematic of an eighth embodiment of a low-power DIM in accordance with the invention.

FIG. 11 illustrates DIM 1100, which combines the features of DIM 700D and DIM 800B in accordance with the invention. Although DIM 700D has a lower static output voltage than DIM 800B due to the threshold voltage drop of both the NMOS and PMOS driver, DIM 700D has the advantage of a slightly faster initial transient due to the fact that gate pull down transistor 760 is connected to the output of the multiplexer and avoids the delay of buffer 730B. The advantages of both DIM 700D and DIM 800B may be combined by using both an NMOS and PMOS to switch the gate of the PMOS, as shown in DIM 1100. Although DIM 1100 is not configurable, it may be designed with control inputs in a similar manner as some of the previously described DIM circuits.

Thus it is seen that circuitry and methods for low-power routing multiplexers are provided. One skilled in the art will appreciate that the invention can be practiced by other than the described embodiments, which are presented for purposes of illustration and not of limitation, and the present invention is limited only by the claims which follow. For example, in accordance with the invention, various embodiments have been illustrated that provide power savings by reducing short-circuit currents, reducing leakage currents, reducing output voltage swing, and recycling gate charge. Some illustrated embodiments use one or more of these techniques to reduce power consumption. Some illustrated embodiments have control inputs which allow the DIM to be switched between different operating modes. It is to be understood that other variations are possible in addition to the illustrated embodiments, which are merely illustrative of a few arrangements.

What is claimed is:

1. Routing driver multiplexer circuitry comprising:
a multiplexer; and
a buffer circuit comprising:
a first stage, comprising a first circuit and a second circuit, both circuits receiving an output signal from the multiplexer and wherein the first circuit is skewed towards a higher trip point than the second circuit;
a second stage having first and second inputs for respectively receiving first and second output signals from the first and second circuits, wherein the second stage further comprises voltage limiting circuitry operative to limit a voltage swing of the output signal from the multiplexer, and wherein the voltage limiting circuitry comprises at least two transistors in series coupled to the output signal from the multiplexer; and
pull-up circuitry adapted to pull up the output signal from the multiplexer output in response to one of the first and second circuits.

2. The routing driver multiplexer circuitry of claim 1 wherein a PMOS to NMOS ratio of the first circuit is greater than a PMOS to NMOS ratio of the second circuit.

3. The routing driver multiplexer circuitry of claim 1 further comprising buffer disable circuitry operative to disable the second stage.

4. The routing driver multiplexer circuitry of claim 3 further comprising a control input operative to control the buffer disable circuitry to enable and disable the buffer.

5. The routing driver multiplexer circuitry of claim 1 further comprising a control input operative to enable and disable the voltage limiting circuitry, wherein the buffer circuit is configured to operate in a low-power mode in response to enabling the voltage limiting circuitry and wherein the buffer circuit is configured to operate in a high-power mode in response to disabling the voltage limiting circuitry.

6. The routing driver multiplexer circuitry of claim 1 wherein the voltage limiting circuitry is operable to reduce a high voltage output of the second inverting stage.

7. The routing driver multiplexer circuitry of claim 1 wherein the voltage limiting circuitry is operable to increase a low voltage output of the second stage.

8. The routing driver multiplexer circuitry of claim 1 wherein the voltage limiting circuitry is operable to reduce a high voltage output of the second stage at least by a threshold voltage of an NMOS transistor.

9. Routing driver multiplexer circuitry comprising:
a multiplexer; and
a buffer circuit comprising:
a first inverting stage comprising a first inverter circuit and a second inverter circuit, both inverter circuits receiving an output signal from the multiplexer, wherein the first and second inverter circuits each comprise an NMOS transistor and a PMOS transistor and wherein the first inverter circuit is skewed towards a higher trip point than the second inverter circuit;
a second inverting stage comprising a PMOS transistor, an NMOS transistor, and an output, the PMOS transistor operable to receive an output signal from the first inverter circuit and to pull up a voltage of the output signal from the multiplexer in response to the output signal from the first inverter circuit, and the NMOS transistor operable to receive an output signal from the second inverter circuit and to pull down the voltage of the output signal from the multiplexer in response to the output signal from the second inverter circuit, wherein the second inverting stage further comprises voltage limiting circuitry operative to limit a voltage swing of the output signal from the multiplexer, and wherein the voltage limiting circuitry comprises at least two transistors in series coupled to the output signal from the multiplexer; and
a pull-up transistor adapted to pull up the voltage of the output signal from the multiplexer in response to one of the output signal from the first inverter circuit and the output signal from the second inverter circuit.

10. The routing driver multiplexer circuitry of claim 9 wherein a ratio of PMOS transistor size of the first inverter circuit to NMOS transistor size of the first inverter circuit is greater than a ratio of PMOS transistor size of the second inverter circuit to NMOS transistor size of the second inverter circuit.

11. The routing driver multiplexer circuitry of claim 9 wherein a voltage of the output signal from the second inverter is lower than a voltage of the output signal from the first inverter circuit during a transition of the second inverting stage.

12. The routing driver multiplexer circuitry of claim 9 further comprising buffer disable circuitry operable to prevent the second inverting stage from turning on.

13. The routing driver multiplexer circuitry of claim 12 wherein the buffer disable circuitry comprises a first transistor operable to prevent the output signal from the first inverter circuit from being pulled down and a second transistor operable to pull up the output signal from the first inverter circuit.

14. The routing driver multiplexer circuitry of claim 13 wherein the first and second transistors are controllable to enable and disable the buffer disable circuitry.

15. The routing driver multiplexer circuitry of claim 9 wherein the voltage limiting circuitry is coupled to an input of the second inverting stage and the output of the second inverting stage.

16. The routing driver multiplexer circuitry of claim 9 wherein the voltage limiting circuitry comprises a voltage limiting NMOS transistor coupled to the PMOS transistor of the second inverting stage and the output of the second inverting stage.

17. The routing driver multiplexer circuitry of claim 9 wherein the voltage limiting circuitry comprises a voltage limiting PMOS transistor coupled to the NMOS transistor of the second inverting stage and the output of the second inverting stage.

18. The routing driver multiplexer circuitry of claim 9 wherein the voltage limiting circuitry further comprises a transistor operable to disable one of the inverter circuits of the first inverting stage.

19. The routing driver multiplexer circuitry of claim 9 wherein the voltage limiting circuitry further comprises a control input operable to activate and de-activate the voltage limiting circuitry, wherein the buffer circuit is configured to operate in a low-power mode in response to activating the voltage limiting circuitry and wherein the routing driver multiplexer circuitry is configured to operate in a high-power mode in response to de-activating the voltage limiting circuitry.

20. A method for reducing the power consumption of a routing driver multiplexer circuit comprising:
receiving an output signal from a multiplexer at each of a first and second circuits of a first routing driver multiplexer circuit buffer stage, wherein the first circuit is skewed toward a higher trip point than the second circuit;
receiving a first and a second output signals from the first and the second circuit respectively at a second routing driver multiplexer circuit buffer stage having a first input to receive the first output signal and a second input to receive the second output;
limiting a voltage swing of the output signal from the multiplexer using voltage limiting circuitry that comprises at least two transistors in series coupled to the output signal from the multiplexer; and
pulling up the output signal from the multiplexer in response to at least one of the output signals of the first and second circuits.

21. The method of claim 20 further comprising selectively disabling the second routing driver multiplexer circuit buffer stage.

22. The method of claim 20 further comprising limiting the voltage swing of an output of the second routing driver multiplexer circuit buffer stage in response to a control input, wherein the control input is operable to switch the buffer circuit between a low-power mode and a high-power mode.

23. The method of claim 20 wherein the limiting comprises reducing a high voltage output of the second routing driver multiplexer circuit buffer stage.

24. The method of claim 20 wherein the limiting comprises increasing a low voltage output of the second routing driver multiplexer circuit buffer stage.

25. The method of claim 20 wherein the limiting comprises reducing the high voltage output of the second routing driver multiplexer circuit buffer stage at least by a threshold voltage of an NMOS transistor.

* * * * *